(12) United States Patent
Van Kampen et al.

(10) Patent No.: US 7,772,024 B2
(45) Date of Patent: Aug. 10, 2010

(54) METHOD OF MANUFACTURING A MICRO-MECHANICAL ELEMENT

(75) Inventors: Robert Van Kampen, s'Hertogenbosch (NL); Charles Gordon Smith, Cambridge (GB); Jack Luo, Cambridge (GB); Andrew John Weeks, S'Hertogenbosch (NL)

(73) Assignee: Cavendish Kinetics Ltd., Hertfordshire (GB)

( * ) Notice: Subject to any disclaimer, the term of this patent is extended or adjusted under 35 U.S.C. 154(b) by 314 days.

(21) Appl. No.: 10/554,642

(22) PCT Filed: Apr. 26, 2004

(86) PCT No.: PCT/GB2004/001773

§ 371 (c)(1),
(2), (4) Date: Oct. 19, 2006

(87) PCT Pub. No.: WO2004/096696

PCT Pub. Date: Nov. 11, 2004

(65) Prior Publication Data

US 2007/0065963 A1 Mar. 22, 2007

(30) Foreign Application Priority Data

Apr. 25, 2003 (NL) .................................... 1023275

(51) Int. Cl.
*H01L 21/00* (2006.01)
(52) U.S. Cl. ................................. 438/48; 257/E23.106
(58) Field of Classification Search ................... 438/48; 257/E23.106
See application file for complete search history.

(56) References Cited

U.S. PATENT DOCUMENTS

| 5,677,823 | A | 10/1997 | Smith |
| 6,509,605 | B1 | 1/2003 | Smith |
| 2002/0100984 | A1* | 8/2002 | Oshima et al. .............. 257/774 |
| 2002/0193037 | A1* | 12/2002 | Hofmann et al. ............... 445/24 |

(Continued)

FOREIGN PATENT DOCUMENTS

EP 0 751 546 1/1997

(Continued)

OTHER PUBLICATIONS

Chan E K et al: "Comprehensive Static Characterization of Vertical Electrostaticallyactuated Polysilicon Beams" IEEE Design & Test of Computers, IEEE Computers Society. Los Alamitos, US, vol. 16, No. 4, Oct. 1999, pp. 58-65, XP000920114; ISSN: 0740-7475, Figure 7, paragraph 'Fabrication!

(Continued)

*Primary Examiner*—Alexander G Ghyka
*Assistant Examiner*—Abdulfattah Mustapha
(74) *Attorney, Agent, or Firm*—Patterson & Sheridan, LLP

(57) ABSTRACT

A method of manufacturing a micromechanical element wherein the method comprises the steps of providing a layer of base material, applying at least one at least partly sacrificial layer of an etchable material, patterning the at least partly sacrificial layer, to define at least a portion of the shape of the element, applying at least one structural layer of a mechanical material, patterning the structural layer to form at least a portion of the element, and removing at least partly the patterned at least partly sacrificial layer to release partly free the element. The mechanical material is selected from the group of conductive materials.

19 Claims, 1 Drawing Sheet

U.S. PATENT DOCUMENTS

Figure 1:
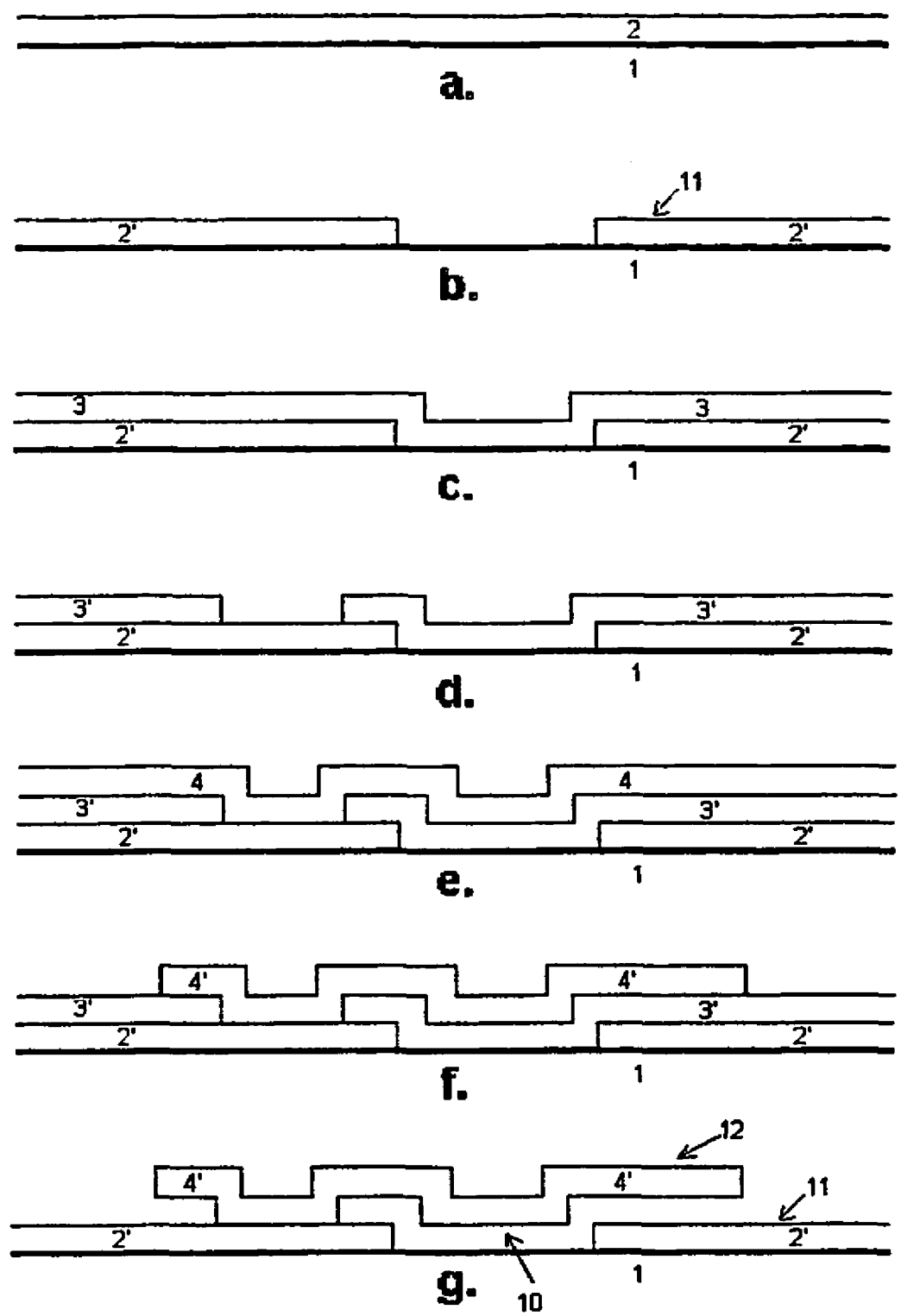

| | | | |
|---|---|---|---|
| 2004/0032639 A1* | 2/2004 | Cirelli et al. | 359/291 |
| 2004/0159532 A1* | 8/2004 | Tatic-Lucic et al. | 200/181 |
| 2004/0188785 A1* | 9/2004 | Cunningham et al. | 257/415 |
| 2005/0164127 A1* | 7/2005 | Reid et al. | 430/311 |

FOREIGN PATENT DOCUMENTS

| | | |
|---|---|---|
| JP | 07-311218 | 11/1995 |
| JP | 9-213191 A | 8/1997 |
| JP | 10-149951 | 6/1998 |
| WO | WO 97/07517 | 2/1997 |
| WO | WO 00/33089 | 6/2000 |
| WO | WO 01/56066 | 8/2001 |
| WO | WO 01/83363 | 11/2001 |
| WO | WO 02/16150 | 2/2002 |
| WO | WO 03/028059 | 4/2003 |
| WO | WO 2007/060416 | 5/2007 |

OTHER PUBLICATIONS

International Preliminary Report on Patentability dated Jun. 17, 2005 for International Application No. PCT/GB2004/001773.
Written Opinion of the International Searching Authority dated Jul. 17, 2005 for International Application No. PCT/GB2004/001773.
Office action for European Patent Application No. 04 729 453.3-1528, dated Sep. 3, 2008.
Notification of the First Office Action dated Dec. 21, 2007 for Chinese Patent Application No. 200480015545.4.
Notification of the Second Office Action dated Dec. 12, 2008 for Chinese Patent Application No. 200480015545.4.
Notification of Reasons(s) for Refusal from Japanese Patent Office for Patent Application No. 2006-506179 dated Jan. 6, 2009.
Notification of Reason(s) for Refusal for Japanese Patent Application No. 2006-506179 dated Jul. 17, 2009.
Notification of Reasons for Refusal for Japanese Patent Application No. 2006-506179 dated Dec. 1, 2009.

* cited by examiner

METHOD OF MANUFACTURING A MICRO-MECHANICAL ELEMENT

The present invention relates generally to techniques for fabricating micro-mechanical structures, and more specifically to sacrificial layer technology for producing micro-electro-mechanical elements that can be used as e.g. switches, relays, fusible links, logic elements or memory elements.

There is a growing demand for micro-(electro-)mechanical devices and structures to be fabricated using silicon-based processing techniques. One area of interest is the use of such devices for switching currents, e.g. JP 2002-170470, JP 2002-23073, EP 1 146 533, EP 1 089 261, WO 99/10907, EP 1 156 499, US 2002/0027487 or WO 99/63559. Techniques for fabricating micro-(electro-)mechanical structures include bulk micro machining of silicon, or surface micro machining using sacrificial layer technology. Sacrificial layer technology is commonly used for making free-standing or lifted-off structures, e.g. DE 10108 663, WO 02/44078, WO 99/35305, WO 01/44822, U.S. Pat. No. 6,251,699, or WO 01/19723. Substrates may include e.g. silicon, silicon oxide, glass, or ceramics. The sacrificial and structural layers may comprise metals e.g. nickel, copper, chromium, cobalt, zinc, iron or an alloy; semiconductor materials e.g. silicon, polysilicon, silicon oxide, silicon nitride; glass e.g. phosphorous silicate glass; polymers, ceramics; photoresist, foil, or any other material that is amenable to precision machining. Standard releasing techniques use dry (plasma) or wet etching of the sacrificial layer(s). WO 02/064495 and WO 98/29720 describe electrochemical etching of a sacrificial layer.

Many of the materials and processes used in bulk or surface micromachining are not compatible with micro-electronic circuitry and are therefore not allowed in semiconductor fabrication facilities. A usual solution to this 'non-compatibility' problem is to fabricate the micro-electronic circuitry part and the micro-(electro-)mechanical part separately and to put them together afterwards, e.g. using a flip-chip process. However, attaching the different parts is generally complicated, in particular since very precise alignment is usually required. This results in high fabrication costs. It would therefore be desirable to have a process to fabricate micro-(electro-)mechanical structures and elements on a substrate comprising micro-electronic, more specifically CMOS (Complementary Metal-Oxide-Semiconductor), circuitry, thereby exclusively applying materials and processing techniques that are commonly used in the semiconductor industry and do not have an adverse effect on the micro-electronic circuitry and the operation thereof. The present invention aims at providing such a process.

The invention provides a method of manufacturing a micro-mechanical element, the method comprising the steps of:
  providing a layer of base material;
  applying at least one, at least partly sacrificial layer of an etchable material;
  patterning the at least partly sacrificial layer, e.g. by lithography and etching, to define at least a portion of the shape of the element;
  applying at least one structural layer of a mechanical material;
  patterning the structural layer, e.g. by lithography and etching, to form at least a portion of the element; and
  removing at least partly the patterned at least partly sacrificial layer to at least partly free the element, whereby the mechanical material is selected from the group of conductive materials.

The layer of base material may be a layer of silicon oxide or other material on a silicon substrate in which or upon which micro-electronic circuitry has been fabricated, but also other substrates may be used such as a gallium arsenide or a ceramic substrate. The base layer may be patterned. The mechanical material being conductive, the element can serve as both a mechanical element as well as an electrical element such as a conductive path and/or an electrode.

In a preferred embodiment of a method according to the present invention, the mechanical material contains titanium, preferably titanium nitride, more preferably nitrogen-rich titanium nitride. These materials are commonly used in the semiconductor industry. Alternatively, the mechanical material may contain platinum, which is also compatible with micro-electronic circuitry but is not as widely available as titanium nitride. Besides being compatible with micro-electronic circuitry, it is important that the mechanical, conductive material does not easily tarnish or form an insulating oxide on its surface. Titanium nitride and platinum are two of the very few materials that meet both requirements. However, any other material meeting these requirements, e.g. tantalum nitride, can be suitable.

Preferably, the etchable material is selected from the group of silicon-based materials such as silicon nitride, amorphous silicon, silicon oxide, and glass e.g. SOG (Spin-On Glass). These materials are also commonly available in semiconductor fabrication facilities. Furthermore, an etch process exists that can etch these materials selectively with respect to titanium nitride. The at least partly removing of the patterned at least partly sacrificial layer can include using a fluorine source gas, preferably nitrogen trifluoride or sulphur hexafluoride, in an etching process, preferably a RF plasma etching process.

For the case that the sacrificial layer is silicon nitride, the etch rate can be increased by controlling the deposition conditions to produce a layer that has a high hydrogen content. A silicon nitride layer having a high hydrogen content can be etched more quickly in e.g. nitrogen trifluoride or sulphur hexafluoride gas. This can be used to reduce the time the substrate material and the other layers are exposed to the etch.

Alternatively, the etchable material may contain a polymer, e.g. polyimide, which is also compatible with micro-electronic circuitry. In that case, the at least partly removing of the patterned at least partly sacrificial layer can include using oxygen gas in a plasma etching process. Either pure oxygen or oxygen containing a fluorine source gas such as carbon tetrafluoride, nitrogen trifluoride or sulphur hexafluoride, can be used.

In a preferred embodiment of a method according to the present invention, the method further includes the steps of:
  applying at least one conductive layer of a conductive material; and
  patterning the conductive layer, e.g. by lithography and etching, to form at least a portion of at least one first electrode.

The conductive material may contain titanium, preferably titanium nitride, more preferably nitrogen-rich titanium nitride. Alternatively, the material may contain platinum. As mentioned before, these materials are more or less commonly used in the semiconductor industry, they are compatible with micro-electronic circuitry and they do not easily tarnish or form an insulating oxide on their surface. However, any other material meeting the requirements, e.g. tantalum nitride, can be suitable.

During the at least partly removing of the patterned at least partly sacrificial layer, a controlled amount of material can be removed from at least part of the surfaces of the at least partly freed element and the first electrode. This allows for precise control of the curvature of the released element, as well as the conductivity of the surfaces of the electrodes in the completed element.

The invention will be more fully understood with reference to the following detailed description in conjunction with FIGS. 1a-1g depicting sequential steps of a fabrication process to manufacture a micro-electro-mechanical element according to a non-limitative example of a preferred embodiment of a method according to the present invention.

In a first step, depicted in FIG. 1a, a conducting layer 2 of nitrogen-rich titanium nitride is deposited on a substrate 1. Titanium nitride is commonly used in most (CMOS) semiconductor fabrication facilities as a barrier layer or as an ARC (Anti-Reflective Coating). In addition the skilled addressee would recognise that each layer of CMOS metal may comprise a titanium nitride layer as a barrier on the bottom and a second titanium nitride layer as an ARC layer on top. Titanium nitride layer may be deposited by reactive sputtering of a titanium target in an argon and nitrogen atmosphere at a relatively low temperature. This technique allows good control over the properties of the deposited titanium nitride layer. Bias sputtering may also be used to better control the properties of the conducting layer 2. In particular nitrogen-rich titanium nitride does not easily tarnish or form an insulating oxide on its surface.

In a second step, depicted in FIG. 1b, the conducting layer 2 is patterned and etched by techniques that are normal in the micro-electronics industry using process equipment commonly available in most semiconductor fabrication facilities. Thus, a non-moveable lower electrode 11 is formed. The exact shape of the patterned conducting layer 2' is specially controlled to enhance the properties of the next layer and subsequent layers and to improve the reliability and yield of the completed element 10. Special process techniques may be used to improve the step coverage by the next layer, to control the roughness and conductivity of the top surface of the patterned conducting layer 2', and to improve the electrical contact properties of the first electrode 11.

In a third step, depicted in FIG. 1c, a sacrificial layer 3 of a silicon-based material is deposited on the patterned conductive layer 2', possibly after a special surface treatment of the conductive layer 2 or the patterned conductive layer 2'. Amorphous silicon or silicon nitride may be used, or any other silicon-based material that has suitable properties, specifically including sputtered amorphous silicon, PECVD (Plasma-Enhanced Chemical Vapour Deposition) amorphous silicon and PECVD silicon nitride. The use of amorphous silicon or silicon nitride is advantageous in particular because these materials are commonly used in the fabrication of micro-electronic circuitry and are available in most semiconductor fabrication facilities, and because these materials may be deposited by sputtering, reactive sputtering or PEVCD at a relatively low temperature that is compatible with any micro-electronic circuitry present on or within the substrate 1. Furthermore, an etch process exists that can etch these materials isotropically or near isotropically, selectively with respect to titanium nitride with a limited and controlled amount of etch into the titanium nitride material. The deposition process of the sacrificial layer 3 may include special features to control the material properties, the geometrical relationship between the sacrificial layer 3 and the other layers, the step coverage, and the interactions between the sacrificial layer 3 and other layers.

In a fourth step, depicted in FIG. 1d, the sacrificial layer 3 is patterned and etched by techniques that are normal in the micro-electronics industry using process equipment commonly available in most semiconductor fabrication facilities. Special process techniques may be used to control the exact shape of the patterned sacrificial layer 3' in order to obtain good step coverage by the next layer.

In a fifth step, depicted in FIG. 1e, a structural layer 4 of nitrogen-rich titanium nitride is deposited on the patterned sacrificial layer 3' and the underlying patterned conductive layer 2'. This process can be identical or similar to the process for depositing the conducting layer 2 in the first step. Apart from the earlier mentioned advantages, titanium nitride shows relatively high mechanical strength so it is suited to be a mechanical material for the element 10. By the means of special control of the deposition process parameters, including the possible use of bias sputtering to better control the properties of the structural layer 4, the curvature of the freed part of the completed element 10 can be controlled, as well as the step coverage of layer 4 over steps in the underlying layers so that there is adequate mechanical and electrical continuity within the completed element 10. Furthermore, the deposition process sequence, which may include sputter etching, is done in such a way that there will be good electrical contact between the patterned conductive layer 2' and the patterned structural layer 4' where these two layers make contact in the completed micro-electro-mechanical element 10.

In a sixth step, depicted in FIG. 1f, the structural layer 4 is patterned and etched by a process equivalent or similar to the process for patterning and etching the conducting layer 2 in the second step. Since the structural layer 4 is made of a conducting material, the released part of the completed element 10 will be electrically conducting and may serve as a conducting path and a moveable upper electrode 12.

In a seventh step, depicted in FIG. 1g, the element 10 is partly released by etching away the patterned sacrificial layer 3' in a plasma etch system using a fluorine source gas such as nitrogen fluoride or sulphur hexafluoride gas. The plasma system may have a single or dual RF power sources so that the plasma density and the average energy of ions bombarding the substrate surface, where the element 10 is located, can be independently controlled. The plasma conditions are specially controlled so that the patterned sacrificial layer 3' is etched away while the patterned layers of titanium nitride 2',4' are not removed and are changed only slightly or remain unchanged. Furthermore, the plasma conditions may be controlled so that only a controlled amount of material is removed from the surface of the electrodes 11,12, and so that the curvature of the released part of the completed element 10 remains within values required for correct operation. It is important that during the release process there is not a time when the differential stress in the released part of the element 10 causes it to bend and touch another surface. If this happens, sticking can occur. For some applications, it is important that this does not happen. The special control of the release etch plasma is performed by precisely controlling the temperature of the substrate 1, the RF power applied on one or both RF electrodes, and the process gas pressure and flow. This allows for precise control of the etching of the exposed surfaces of the titanium nitride layers 2',4' and the curvature of the released part of the element 10, as well as the conductivity of the surfaces of the titanium nitride electrodes 11,12. After the release etch, a special post-treatment may be performed to modify the surfaces of the electrodes 11,12 to reduce the contact resistance between the electrodes 11,12 when they are brought into contact with each other.

For the case that the sacrificial layer 3 is silicon nitride, the etch rate can be controlled by controlling the deposition conditions to produce a layer that has a high hydrogen content. A silicon nitride layer having a high hydrogen content can be etched more quickly in e.g. nitrogen trifluoride or sulphur hexafluoride gas. This can be used to reduce the time the substrate material and titanium nitride are exposed to the etch.

All the materials used to fabricate the micro-electro-mechanical element 10, whether they be permanent (such as the conductive layer 2 and the structural layer 4) or temporary (such as the sacrificial layer 3), are fully compatible with micro-electronic, in particular CMOS, circuitry, in terms of the properties of the materials as well as all the processes used to perform deposition, patterning and etching and all other processing of these materials.

In particular, all the processes required to fabricate the micro-electro-mechanical element 10 may be performed without causing any significant adverse affect on micro-electronic, in particular CMOS, circuitry, and if the micro-electro-mechanical element fabrication process does cause any change in the micro-electronic circuitry, these changes may be reversed or compensated by minor modifications to the normal fabrication processes used to produce the micro-electronic circuitry so that the micro-electronic circuitry is capable of operating within its normal specifications.

Thus, full advantage can be taken from the higher throughputs, smaller line widths and device sizes, larger wafer areas, and lower fabrication costs inherent to existing semiconductor e.g. CMOS fabrication facilities, without the need for a laborious and troublesome process of handling, aligning and attaching separate micro parts.

The invention claimed is:

1. Method of manufacturing a micro-mechanical element, the method comprising the steps of:
   providing a layer of base material;
   applying at least one partly sacrificial layer of an etchable material;
   patterning the partly sacrificial layer to define at least a portion of the shape of the element, wherein the element comprises at least one structural layer;
   applying the at least one structural layer of a mechanical material, the at least one structural layer consisting entirely of titanium nitride;
   patterning the structural layer to form at least a portion of the element; and
   removing at least partly the patterned at least partly sacrificial layer to at least partly free the element.

2. Method according to claim 1, whereby the etchable material is selected from the group of silicon-based materials.

3. Method according to claim 2, whereby the etchable material contains silicon nitride.

4. Method according to claim 3, whereby the etch rate of the silicon nitride is increased by increasing the hydrogen content.

5. Method according to claim 2, whereby the etchable material contains amorphous silicon.

6. Method according to claim 2, whereby the etchable material contains silicon oxide.

7. Method according to claim 2, whereby the etchable material contains spin-on glass.

8. Method according to claim 1, whereby the etchable material contains a polymer.

9. Method according to claim 2, whereby the at least partly removing of the patterned at least partly sacrificial layer includes using a fluorine gas in an etching process.

10. Method according to claim 8, whereby the at least partly removing of the patterned at least partly sacrificial layer includes using oxygen gas in a plasma etching process.

11. Method according to claim 1, further including the steps of: applying at least one conductive layer of a conductive material; and patterning the conductive layer to form at least a portion of at least one first electrode.

12. Method according to claim 11, whereby the conductive material contains titanium.

13. Method according to claim 12, whereby the conductive material contains titanium nitride.

14. Method according to claim 11, whereby the conductive material contains platinum.

15. Method according to claim 11, whereby during at least partly removing of the patterned at least partly sacrificial layer a controlled amount of a material is removed from at least part of the surface of the first electrode.

16. Method according to claim 1, whereby during the at least partly removing of the patterned at least partly sacrificial layer a controlled amount of material is removed from at least part of the surface of the free part of the element.

17. A method of manufacturing a micro-mechanical element, comprising:
   depositing a first conductive layer over a substrate;
   patterning the first conductive layer to expose the substrate and form a patterned first conductive layer and a first electrode;
   depositing a sacrificial layer over the patterned first conductive layer, the first electrode and the exposed substrate;
   patterning the sacrificial layer to expose the patterned first conductive layer;
   depositing a second conductive layer comprising titanium nitride on the exposed patterned first conductive layer and the patterned sacrificial layer;
   patterning the second conductive layer to form a micro-mechanical element in contact with the patterned first conductive layer and the patterned sacrificial layer, the micro-mechanical element consisting entirely of the second conductive layer; and
   removing the patterned sacrificial layer such that a portion of the micro-mechanical element is spaced from the first electrode.

18. The method of claim 17, wherein the first conductive layer comprises titanium nitride.

19. The method of claim 17, wherein the sacrificial layer comprises spin on glass.

* * * * *